United States Patent [19]

Kuo et al.

[11] Patent Number: 4,975,882
[45] Date of Patent: Dec. 4, 1990

[54] USER PROGRAMMABLE REDUNDANT MEMORY

[75] Inventors: Clinton C. K. Kuo; Ernest A. Carter; Joseph Jelemensky, all of Austin, Tex.

[73] Assignee: Motorola, Inc., Schaumburg, Ill.

[21] Appl. No.: 429,956

[22] Filed: Oct. 30, 1989

[51] Int. Cl.⁵ .................................................. G11C 7/00
[52] U.S. Cl. .................................... 365/200; 365/230.03; 371/10.3
[58] Field of Search ......................... 365/200, 230.03; 371/10.1, 10.2, 10.3

[56] References Cited

U.S. PATENT DOCUMENTS

| | | | |
|---|---|---|---|
| 4,758,988 | 7/1988 | Kuo | 365/200 |
| 4,809,228 | 2/1989 | Iida | 365/200 |
| 4,922,456 | 5/1990 | Naddor et al. | 365/200 |

Primary Examiner—Joseph E. Clawson, Jr.
Attorney, Agent, or Firm—Robert L. King

[57] ABSTRACT

A memory has a programmable circuit which allows a user to select an amount of redundancy the memory has varying from zero percent to one-hundred percent. A received address is compared by the circuit with a redundancy percentage control signal to determine if the address falls within a redundant portion of the memory. If so, a redundancy enable signal is asserted to allow the memory to utilize the redundant circuitry.

11 Claims, 4 Drawing Sheets

| CONTROL BITS $C_7\ C_6\ C_5\ C_4\ C_3\ C_2\ C_1\ C_0\ RC$ | NUMBER OF BYTES WITH REDUNDANCY | NUMBER OF BYTES WITHOUT REDUNDANCY | ADDRESS FOR BYTES WITH REDUNDANCY | ADDRESS FOR BYTES WITHOUT REDUNDANCY |
|---|---|---|---|---|
| 1 1 1 1 1 1 1 1 1 | 4,096 | 0 | 0000-0FFF | NONE |
| 0 1 1 1 1 1 1 1 1 | 2,048 | 4,096 | 0800-0FFF | 0000-07FF<br>1000-17FF |
| 0 0 1 1 1 1 1 1 1 | 1,024 | 6,144 | 0C00-0FFF | 0000-0BFF<br>1000-1BFF |
| 0 0 0 1 1 1 1 1 1 | 512 | 7,168 | 0E00-0FFF | 0000-0DFF<br>1000-1DFF |
| 0 0 0 0 1 1 1 1 1 | 256 | 7,680 | 0F00-0FFF | 0000-0EFF<br>1000-1EFF |
| 0 0 0 0 0 1 1 1 1 | 128 | 7,936 | 0F80-0FFF | 0000-0F7F<br>1000-1F7F |
| 0 0 0 0 0 0 1 1 1 | 64 | 8,004 | 0FC0-0FFF | 0000-0FBF<br>1000-1FBF |
| 0 0 0 0 0 0 0 1 1 | 32 | 8,128 | 0FE0-0FFF | 0000-0FDF<br>1000-1FDF |
| 0 0 0 0 0 0 0 0 1 | 16 | 8,160 | 0FF0-0FFF | 0000-0FEF<br>1000-1FEF |
| 0 0 0 0 0 0 0 0 0 | 0 | 8,192 | NONE | 0000-1FFF |

*FIG. 4*

USER PROGRAMMABLE REDUNDANT MEMORY

TECHNICAL FIELD

This invention relates to memory circuits, and more particularly, to memory circuits which have redundancy.

BACKGROUND OF THE INVENTION

A common concern with semiconductor memories is the reliability of the memory. Of particular concern with memories that are electrically programmable is the memory's endurance or number of cycles which such memories must be erased and re-programmed. For example, electrically erasable programmable read only memories (EEPROMs) require an endurance of many thousands of cycles in some applications. Although the intrinsic endurance of a memory is greater than one million cycles, the actual endurance of a typical memory is limited to approximately ten thousand cycles. The relatively low endurance of memories results from random defects in transistor gate oxides and thin tunnel dielectrics commonly existing in most semiconductor processes. Therefore, in applications requiring a memory with high endurance or reliability, a memory must be fabricated with either redundancy or error checking and correction (ECC) circuitry. Known redundancy techniques other than ECC circuitry which are used in EEPROMs use either a one hundred percent duplication of all memory cells or a one hundred percent duplication of all arrays of the memory. A disadvantage with the known redundancy techniques is the additional size required for duplicate memory cells and many applications do not require one hundred percent redundancy. With respect to the ECC approach, less memory circuitry is duplicated but additional circuitry and control functions are required to create a large increase in the overhead of the system utilizing the memory.

SUMMARY OF THE INVENTION

Accordingly, it is an object of the present invention to provide an improved user programmable redundant memory.

Another object of the present invention is to provide an improved method and apparatus for selectively programming a predetermined redundancy into a memory.

In carrying out the above and other objects of the present invention, there is provided, in one form, a method and circuit for externally programming a desired amount of redundancy into a memory which stores data. A first portion of the circuit receives a redundancy size signal which is controlled by a user. The redundancy size signal defines a percentage of the memory which is to be redundant by enabling redundant circuitry in the memory for the storing of data. A second portion of the circuit is coupled to the first portion for receiving both the redundancy size signal and an address signal which addresses a data operand to be communicated by the memory. The second portion enables the memory to utilize the redundant circuitry when the address signal addresses a data operand in a redundant portion of the memory defined by the redundancy size signal.

These and other objects, features, and advantages, will be more clearly understood from the following detailed description taken in conjunction with the accompanying drawings.

BRIEF DESCRIPTION OF THE DRAWINGS

FIG. 4 illustrates in tabular form circuit values associated with FIGS. 1-3.

DETAILED DESCRIPTION OF THE INVENTION

Figure 1:
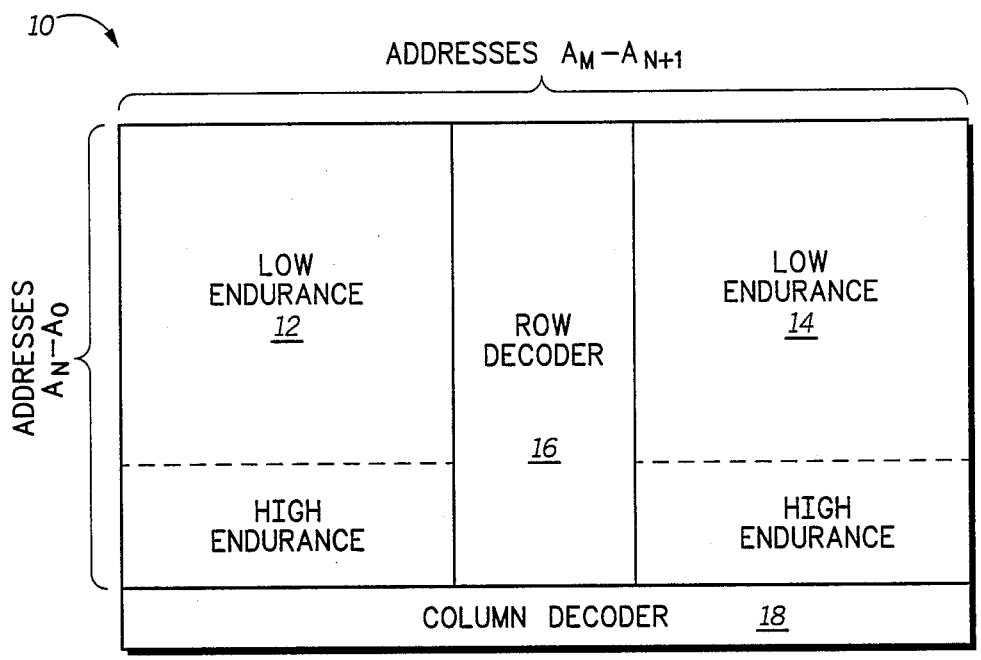
FIG. 1 illustrates in block diagram form an organizational diagram of a memory in accordance with the present invention.

Shown in FIG. 1 is a block diagram of a memory 10 having a first array 12 with high and low endurance sections, a second array 14 also with high and low endurance sections, a row decoder 16 and a column decoder 18. Row addresses, as decoded by row decoder 16 and labeled "$A_N$" thru "$A_0$", each address a predetermined row spanning across both first array 12 and second array 14. Similarly, column addresses as decoded by column decoder 18 and labeled "$A_M$" thru "$A_{N+1}$", each address a predetermined column in one of either first array 12 or second array 14. In the illustrated form, data operands are stored horizontally across memory 10 spanning arrays 12 and 14. In a commonly found form of memeories, such as in an EEPROM, arrays 12 and 14 are concurrently addressed and the data logically combined to provide a data output. In known redundant memories, first array 12 is completely duplicated in second array 14 to create a mirror image. In contrast, the present invention functions to allow a user of memory 10 to program only the portion of memory 10 which is desired by the user to be redundant. As shown in FIG. 1, the lower portions of first and second arrays 12 and 14 are duplicated and are therefore high endurance. Should a memory cell in the high endurance portion of first array 12 fail after being re-programmed a large number of times, a duplicate cell in the high endurance portion of second array 14 will exist to provide the required data. Memory addresses which a user knows will not be addressed a very large number of times may be assigned to the low endurance portion of either array 12 or array 14. Therefore, the present invention provides a memory 10 which may be customized with respect to redundancy for specific application needs. It should be noted that by using the lower portion of each of arrays 12 and 14 for implementing the high endurance, continuity of the memory addresses exists from the bottom of array 12 to the top of array 14. Once a portion of memory 10 is used for redundancy, memory 10 is divided into three contiguous sub-arrays starting with a low endurance sub-array of array 12, a high endurance sub-array of array 12 and a low endurance sub-array of array 14.

In a preferred form, memory 10 is an EEPROM array organized having $2^N$ rows and $2^{(M-N)}$ columns of eight bit bytes, where M and N are integer values. In a memory having two hundred fifty-six rows and two hundred fifty-six columns, the memory would contain a number of memory cells equal to 8,192 multiplied by eight. Any byte in the array can be addressed with the addresses $A_M, A_{M-1}, \ldots A_N$ thru $A_0$. Memory 10 can be partitioned to have K rows out of $2^N$ rows for high endurance storage, where:

$$K = 2^Q \tag{1}$$

wherein Q is an integer less than or equal to N. It should be well understood that although the present invention is shown in the form of substantially two halves, the present invention may be implemented with redundancy in only one portion of a memory. For example, the redundancy technique taught herein may be implemented in either a linear or exponential number of blocks or modules of memory.

Figure 2:
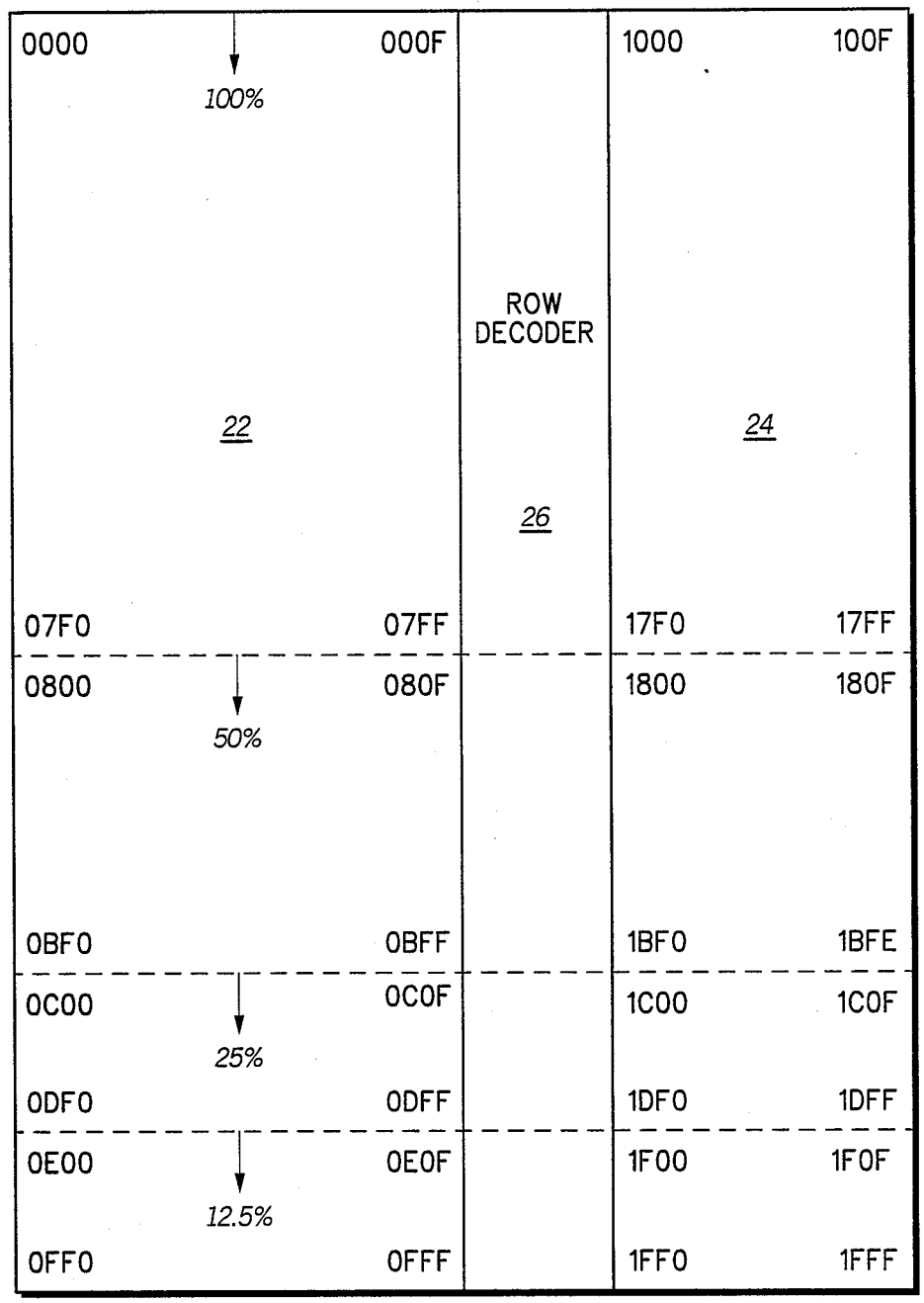
FIG. 2 illustrates in block diagram form exemplary address assignments in a memory using the present invention.

Shown in FIG. 2 is an example of memory cell address assignments in a memory implemented in accordance with the present invention. A memory 20 generally comprises both a first array 22 and a second array 24 separated by a row decoder 26. Memory 20 is illustrated in FIG. 2 having address assignments in each of arrays 22 and 24 for twelve and one-half percent redundancy, twenty-five percent redundancy, fifty percent redundancy and one-hundred percent redundancy. The addresses in array 22 range from 0000 to 0FFF representing 4,096 bytes of data assuming the memory parameters discussed immediately above. The addresses in array 24 range from 1000 to 1FFF wherein array 24 is the same as array 22. A column decoder (not shown) is assumed to exist below arrays 22 and 24 for decoding column addresses.

Figure 3:
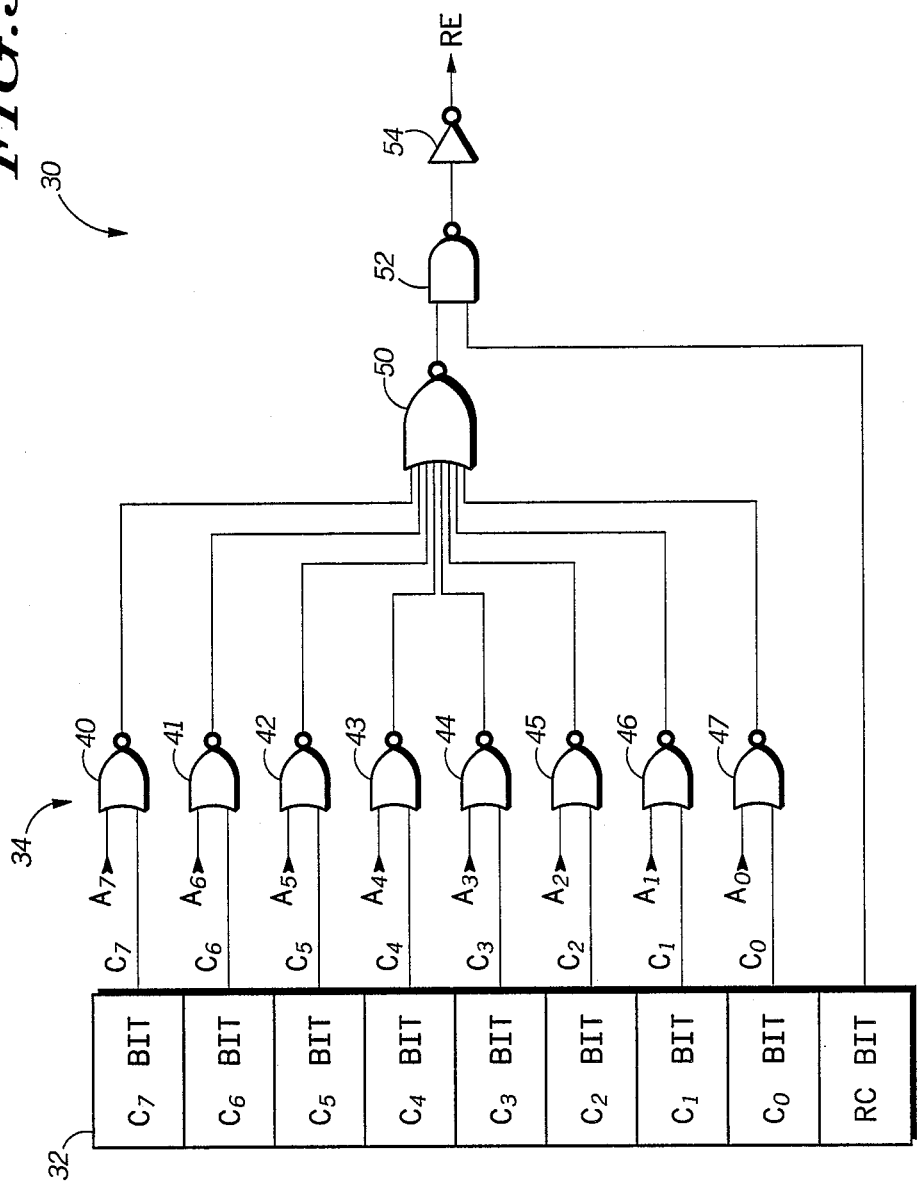
FIG. 3 illustrates in logic diagram form a programming circuit in accordance with the present invention for use with the memory of FIG. 1.

Shown in FIG. 3 is a logic diagram of a redundancy enable programming circuit 30 in accordance with the present invention. Programming circuit 30 functions to generate a redundancy enable signal labeled "RE" to indicate that an addressed byte of data is in a high endurance portion of the memory rather than a low endurance portion. Programming circuit 30 generally comprises a register 32 and a logic portion 34. Register 32 is a multi-bit register having eight ranked bits respectively labeled "$C_0$ thru $C_7$" in order of increasing rank and having a redundancy bit labeled "RC". Logic portion 34 comprises a ranked plurality of two input NOR gates 40–47, each of which has an output connected to a predetermined input of an eight input NOR gate 50. A first input of NOR gate 40 is connected to an address input bit labeled "$A_7$", and a second input of NOR gate 40 is connected to bit $C_7$. A first input of NOR gate 41 is connected to an address input bit labeled "$A_6$", and a second input of NOR gate 41 is connected to bit $C_6$. A first input of NOR gate 42 is connected to an address input bit labeled "$A_5$", and a second input of NOR gate 42 is connected to bit $C_5$. A first input of NOR gate 43 is connected to an address input bit labeled "$A_4$", and a second input of NOR gate 43 is connected to bit $C_4$. A first input of NOR gate 44 is connected to an address input bit labeled "$A_3$", and a second input of NOR gate 44 is connected to bit $C_3$. A first input of NOR gate 45 is connected to an address input bit labeled "$A_2$", and a second input of NOR gate 45 is connected to bit $C_2$. A first input of NOR gate 46 is connected to an address input bit labeled "$A_1$", and a second input of NOR gate 46 is connected to bit $C_1$. A first input of NOR gate 47 is connected to an address input bit labeled "$A_0$", and a second input of NOR gate 47 is connected to bit $C_0$. An output of NOR gate 50 is connected to a first input of a NAND gate 52. A second input of NAND gate 52 is connected to the RC bit of register 32. An output of NAND gate 52 is connected to an input of an inverter 54, and an output of inverter 54 provides the redundancy enable bit, RE.

In operation, a user programs the amount of redundancy desired in memory 10 by the value of the command C signal which is loaded into register 32 in the form of bits $C_0$–$C_7$. The RC bit programmed by the user can totally eliminate redundancy or can enable the redundancy feature depending upon the RC bit's logic value. Programming circuit 30 functions to assert the RE bit whenever a byte of data in memory 10 being addressed by address bits $A_0$–$A_7$, representing address bits $A_0$–$A_N$ of FIG. 1, resides within the high redundancy portion programmed into memory 10 by redundancy control bits $C_0$–$C_7$. In one form, the RE redundancy enable bit enables each of arrays 12 and 14 when asserted thereby implementing the intended redundancy. For cell type redundancies which are not shown, both cells in a bit may be selected in response to the assertion of the RE bit to implement redundancy. It should be well understood that redundancy control bits $C_0$ thru $C_7$ may be user altered either directly or indirectly thru a CPU or other mechanism in a system.

Shown in FIG. 4 is a table illustrating the operation of programming circuit 30 for various values of the control bits in register 32. Also included in the FIG. 4 table is a particular example of the number of bytes with and without redundancy for given control bit values assuming the previously discussed sized memory. For comparison purposes, address bits identifying a portion of particular bytes in memory 20 are also included in the FIG. 4 table. It should be noted that in the illustrated form redundancy exists only if the RC bit is asserted with a logic one value. As an example, when all control bits except bit $C_7$ is logically asserted by a user, the user has chosen that memory 20 has exactly fifty percent redundancy. NOR gates 40–47 function to provide the redundancy enable RE bit only if an address, as defined by bits $A_0$–$A_7$, resides in the portion of memory 20 which is selected to be redundant. If the address is a selected redundant address, none of the outputs of NOR gates 40–47 will be asserted and the output of NOR gate 50 will be a logic one. Since the redundancy control RC bit is also asserted in this assumed circuit operation, the output of NAND gate 52 is not asserted and the RE bit is asserted. The RE bit may then allow two data operands to be outputted by memory 20 and logically verified as to correctness. In this manner, a memory is provided having only an amount of redundancy desired by a user.

By now it should be apparent that a memory with a readily programmable amount of redundancy has been provided. The present invention provides a user with the flexiblity of achieving the best possible compromise between endurance and circuit density in a particular application for a memory. It should be noted that the present invention, while discussed in the context of a non-volatile EEPROM, may be implemented in any programmable memory which returns to a known or predictable state when charge stored by the memory is lost due to charge leakage. Such memories include EPROMs, flash EEPROMs and dynamic RAMs. The present invention permits one memory design to be used for zero to one hundred percent redundancy thru external user programming. As a result, a significant savings in the size of a memory with redundancy may be realized.

While there have been described hereinabove the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A user programmable redundant memory having a predetermined amount of redundant circuitry controlled by the user, comprising:

first means for receiving a redundancy size signal controlled by the user for selectively changing between predetermined amounts of memory redundancy in response to user variation of values of the redundancy size signal, said redundancy size signal's value defining one of a plurality of predetermined percentages of the memory which is to be redundant by enabling redundant circuitry in the memory for storing data; and second means coupled to the first means, said second means receiving both the redundancy size signal and an address signal addressing a data operand to be communicated by the memory, said second means enabling the memory to utilize the redundant circuitry in the memory when the address signal addresses a data operand in a redundant portion of the memory defined by the redundancy size signal.

2. The user programmable redundant memory of claim 1 wherein said first means further comprises a multi-bit storage register for storing the redundancy size signal.

3. The user programmable redundant memory of claim 2 wherein said second means further comprises:

logic circuitry for receiving the redundancy size signal, the address signal and an enable signal provided by the user for enabling any memory redundancy to be utilized, said redundancy signal being implemented as a single bit stored by the multi-bit storage register.

4. The user programmable redundant memory of claim 3 wherein said logic circuitry further comprises:

a plurality of logic gates, each of which receives a predetermined address bit of the address signal and a predetermined bit of the redundancy size signal, said plurality of logic gates providing a plurality of logic signals;

a first logic gate for receiving the plurality of logic signals and providing an output indicating if the address signal is within a redundant portion of the memory as determined by the redundancy size signal; and a second logic gate coupled to the first logic gate for receiving the enable signal and the output of the first logic gate, said second logic gate outputting the output of the first logic gate only if said enable signal is asserted.

5. The user programmable redundant memory of claim 4 wherein each of the plurality of logic gates are NOR gates, said first logic gate is a NOR gate, and said second logic gate is a NAND gate.

6. The user programmable redundant memory of claim 1 wherein the memory is an EEPROM.

7. In a memory circuit which stores data, a method of user custom programming a predetermined amount of redundant circuitry in the memory circuit, comprising the steps of:

structuring the memory to have a portion thereof comprising two halves, a programmable percentage of a first half of the programmable percentage of a second half of the portion;

receiving a redundancy size signal provided by said user for selectively changing between predetermined amounts of memory redundancy in response to user variation of values of the redundancy size signal, said redundancy size signal's value defining one of a plurality of predetermined percentages of the memory circuit which is to have redundant circuitry;

receiving an address indicative of a location in the memory circuit of data which is to be communicated; and providing a redundancy signal for use by the memory circuit when the received address is within said percentage of the portion of the memory circuit which has redundant circuitry.

8. The method of claim 7 further comprising the step of:

implementing the memory circuit as one of either an EEPROM, a flash EPROM or a DRAM.

9. The method of claim 7 wherein said redundancy signal is provided by:

logically comparing the received address with the redundancy size signal to determine whether said redundancy signal should be asserted.

10. The method claim of 7 further comprising the step of:

storing the redundancy size signal in a register after receipt thereof.

11. The method of claim 7 wherein said portion of the memory circuit is substantially all of the memory circuit.

* * * * *